(12) United States Patent
Biard (10) Patent No.: US 12,362,173 B2
(45) Date of Patent: Jul. 15, 2025

(54) METHOD FOR MANUFACTURING A COMPOSITE STRUCTURE COMPRISING A THIN LAYER OF MONOCRYSTALLINE SIC ON AN SIC CARRIER SUBSTRATE

(71) Applicant: Soitec, Bernin (FR)

(72) Inventor: Hugo Biard, Grenoble (FR)

(73) Assignee: SOITEC, Bernin (FR)

(*) Notice: Subject to any disclaimer, the term of this patent is extended or adjusted under 35 U.S.C. 154(b) by 578 days.

(21) Appl. No.: 17/756,609

(22) PCT Filed: Oct. 26, 2020

(86) PCT No.: PCT/FR2020/051929
§ 371 (c)(1),
(2) Date: May 27, 2022

(87) PCT Pub. No.: WO2021/105576
PCT Pub. Date: Jun. 3, 2021

(65) Prior Publication Data
US 2022/0415653 A1 Dec. 29, 2022

(30) Foreign Application Priority Data

Nov. 29, 2019 (FR) ........................... 1913553
Mar. 27, 2020 (FR) ........................... 2003025

(51) Int. Cl.
*H01L 21/02* (2006.01)
*C23C 14/48* (2006.01)
(Continued)

(52) U.S. Cl.
CPC ........ *H01L 21/02529* (2013.01); *C23C 14/48* (2013.01); *C23C 16/01* (2013.01);
(Continued)

(58) Field of Classification Search
CPC ......... H01L 21/02378; H01L 21/02529; H01L 2924/10272; H01L 21/02002;
(Continued)

(56) References Cited

U.S. PATENT DOCUMENTS 8,436,363 B2  5/2013 Werkhoven et al.
11,107,893 B2 * 8/2021 Schulze .............. H01L 21/0485
(Continued)

FOREIGN PATENT DOCUMENTS

CN  104051242 A  9/2014
DE  102014103518 A1  9/2014
(Continued)

OTHER PUBLICATIONS

Taiwanese Office Action and Search Report for Application No. 109135222 dated Jul. 23, 2024, 9 pages with English translation.
(Continued)

*Primary Examiner* — Latanya N Crawford Eason
(74) *Attorney, Agent, or Firm* — TraskBritt (57) ABSTRACT

A method for manufacturing a composite structure comprises: a) providing an initial substrate made of monocrystalline silicon carbide, b) epitaxially growing a monocrystalline silicon carbide donor layer on the initial substrate to form a donor substrate, c) implanting ions into the donor layer to form a buried brittle plane defining the donor layer, d) depositing, using liquid injection-chemical vapor deposition at a temperature below 1000° C., a carrier layer on the donor layer, the carrier layer comprising an at least partially amorphous SiC matrix, e) separating the donor substrate along the brittle plane to form an intermediate composite structure comprising the donor layer on the carrier layer f) heat treating the intermediate composite structure at a temperature of between 1000° C. and 1800° C. to crystallize the carrier layer and form the polycrystalline carrier substrate,
(Continued)

and g) applying mechanical and/or chemical treatment(s) of the composite structure.

20 Claims, 3 Drawing Sheets

(51) Int. Cl.
  *C23C 16/01* (2006.01)
  *C23C 16/32* (2006.01)
  *C23C 16/448* (2006.01)
  *C23C 16/56* (2006.01)
  *C30B 25/20* (2006.01)
  *C30B 29/36* (2006.01)
  *H01L 21/306* (2006.01)

(52) U.S. Cl.
  CPC ........ *C23C 16/325* (2013.01); *C23C 16/4482* (2013.01); *C23C 16/56* (2013.01); *C30B 25/20* (2013.01); *C30B 29/36* (2013.01); *H01L 21/02378* (2013.01); *H01L 21/0262* (2013.01); *H01L 21/02667* (2013.01); *H01L 21/30625* (2013.01)

(58) Field of Classification Search
  CPC ......... H01L 21/02005; H01L 21/02008; H01L 21/0201; H01L 21/02027; H01L 21/76254; H01L 21/02433; H01L 21/02656; H01L 21/02664; H01L 21/02667; H01L 21/324; H01L 21/3247; H01L 21/02447; H01L 21/0262; H01L 21/02658; H01L 21/30625; H01L 21/02032; C30B 29/36; C30B 25/18; C30B 25/20; C30B 25/186; C30B 25/183; C30B 23/02; C30B 23/025; C30B 25/02; C30B 31/22; C30B 33/02; C23C 16/325; C23C 14/48; C23C 16/56; C23C 16/4482; C23C 16/01

See application file for complete search history.

(56) References Cited

U.S. PATENT DOCUMENTS

| | | |
|---|---|---|
| 2003/0159644 A1 | 8/2003 | Yonehara et al. |
| 2009/0221131 A1 | 9/2009 | Kubota et al. |
| 2013/0062628 A1 | 3/2013 | Das et al. |
| 2014/0264374 A1 | 9/2014 | Hecht et al. |
| 2015/0270351 A1 | 9/2015 | Nishio et al. |
| 2018/0251910 A1 | 9/2018 | Akiyama et al. |
| 2019/0013198 A1 | 1/2019 | Toh et al. |

FOREIGN PATENT DOCUMENTS

| | | |
|---|---|---|
| EP | 3168862 A1 | 5/2017 |
| JP | 01-220458 A | 9/1989 |
| JP | 2007-230810 A | 9/2007 |
| JP | 2007-273524 A | 10/2007 |
| JP | 2015-002207 A | 1/2015 |
| JP | 2015-005702 A | 1/2015 |
| JP | 2017-057102 A | 3/2017 |
| TW | 201724179 A | 7/2017 |
| TW | 201311946 A | 3/2024 |

OTHER PUBLICATIONS

Boisselier, Guilhaume, Thesis titled Chemical vapour deposition of chromium, silicon and hafnium carbides, assisted by pulsed liquid injection, (2013), 172 pages.

International Search Report for International Application No. PCT/FR2020/051929 dated Feb. 25, 2021, 2 pages.

International Written Opinion for International Application No. PCT/FR2020/051929 dated Feb. 25, 2021, 7 pages.

Mu et al., (Invited) Room Temperature Wafer Bonding of Wide Bandgap Semiconductors, ECS Transactions, vol. 86, No. 5, (2018), pp. 3-21.

Japanese Notice of Reasons for Rejection for Application No. 2022-523652 dated Feb. 4, 2025, 6 pages.

* cited by examiner

METHOD FOR MANUFACTURING A COMPOSITE STRUCTURE COMPRISING A THIN LAYER OF MONOCRYSTALLINE SIC ON AN SIC CARRIER SUBSTRATE

CROSS-REFERENCE TO RELATED APPLICATIONS

This application is a national phase entry under 35 U.S.C. § 371 of International Patent Application PCT/FR2020/051929, filed Oct. 26, 2020, designating the United States of America and published as International Patent Publication WO 2021/105576 A1 on Jun. 3, 2021, which claims the benefit under Article 8 of the Patent Cooperation Treaty to French Patent Application Serial No. FR1913553, filed Nov. 29, 2019 and French Patent Application Serial No. FR2003025, filed Mar. 27, 2020.

TECHNICAL FIELD

The present disclosure relates to the field of semiconductor materials for microelectronic components. The present disclosure relates in particular to a process for manufacturing a composite structure comprising a thin layer of monocrystalline silicon carbide on a carrier substrate made of silicon carbide.

BACKGROUND

Interest in silicon carbide (SiC) has increased considerably over the last few years because this semiconductor material is able to increase the capacity to handle energy. SiC is increasingly widely used for manufacturing innovative power devices to meet the needs of rising fields in electronics, notably such as electric vehicles.

Power devices and integrated power supply systems based on monocrystalline silicon carbide are able to manage a much higher power density than their traditional silicon homologues, and do so with smaller active-zone dimensions. To further limit the dimensions of power devices on SiC, it is advantageous to manufacture vertical instead of lateral components. For this, vertical electrical conduction, between an electrode arranged on the front face of the SiC structure and an electrode arranged on the rear face, must be allowed by the structure.

However, monocrystalline SiC substrates intended for the microelectronics industry are still expensive and difficult to supply at a large size. It is therefore advantageous to make use of thin-layer transfer solutions to produce composite structures, which typically comprise a thin layer of monocrystalline SiC on a less expensive carrier substrate. One well-known thin-layer transfer solution is the Smart Cut™ process, based on implanting light ions and assembling by direct bonding. Such a process makes it possible, for example, to manufacture a composite structure comprising a thin layer of monocrystalline SiC (c-SiC), taken from a c-SiC donor substrate, in direct contact with a carrier substrate made of polycrystalline SiC (p-SiC), and allowing vertical electrical conduction. However, it remains difficult to achieve high-quality direct bonding by molecular adhesion between two substrates made of c-SiC and p-SiC, since managing the surface state and roughness of these substrates is complex.

Various methods derived from this process are also known from the prior art. For example, F. Mu et al. (ECS Transactions, 86 (5) 3-21, 2018) implement direct bonding after activating the surfaces to be assembled by bombardment with argon (SAB: "surface activation bonding"): such a treatment prior to bonding generates a very high density of side bonds, which promote the formation of covalent bonds at the assembly interface, and hence a high bonding energy. However, this method has the drawback of generating an amorphous layer at the surface of the monocrystalline SiC donor substrate, which negatively affects vertical electrical conduction between the thin layer of c-SiC and the carrier substrate made of p-SiC.

Solutions have been proposed to solve this problem, in particular in EP3168862, involving the implantation of dopant species into the amorphous layer in order to restore its electrical properties. The main drawback of this approach is its complexity and hence its cost.

Also known is U.S. Pat. No. 8,436,363, which describes a process for manufacturing a composite structure comprising a thin layer of c-SiC arranged on a metal carrier substrate, the coefficient of thermal expansion of which is matched to that of the thin layer. This manufacturing process comprises the following steps:
 forming a buried brittle plane in a c-SiC donor substrate, delimiting a thin layer between the buried brittle plane and a front surface of the donor substrate;
 depositing a layer of metal, for example, of tungsten or molybdenum, on the front surface of the donor substrate to form the carrier substrate with sufficient thickness to act as a stiffener;
 separating along the buried brittle plane to form, on the one hand, the composite structure comprising the metal carrier substrate and the thin layer of c-SiC and, on the other hand, the rest of the c-SiC donor substrate.

Such a manufacturing process is, however, not compatible when the material forming the carrier substrate is p-SiC requiring deposition at temperatures above 1200° C. (usual temperatures for the manufacture of p-SiC). Specifically, at these high temperatures, the growth kinetics of the cavities present in the buried brittle plane are faster than the growth kinetics of the p-SiC layer and the thickness required for a stiffening effect is not reached before blistering starts to occur, which is related to the deformation of the layer vertically in line with the cavities.

Irrespective of the layer transfer technique used, the additional problem arises of providing a composite structure comprising a thin c-SiC layer of very high quality, and, in particular, free of extended defects (or having a very low density thereof), which are liable to affect the performance qualities and the reliability of power devices intended to be produced on the thin layer.

BRIEF SUMMARY

The present disclosure relates to an alternative solution to those of the prior art, and is directed toward completely or partly overcoming the abovementioned drawbacks. The present disclosure relates, in particular, to a process for manufacturing a composite structure comprising a high-quality thin layer of c-SiC on a carrier substrate made of SiC.

The present disclosure relates to a process for manufacturing a composite structure comprising a thin layer of monocrystalline silicon carbide arranged on a carrier substrate made of silicon carbide. The process comprises:
 a) a step of providing an initial substrate made of monocrystalline silicon carbide,
 b) a step of epitaxial growth of a monocrystalline silicon carbide donor layer on the initial substrate, to form a donor substrate, the donor layer having a density of crystal defects less than that of the initial substrate, c) a step of ion implantation of light species into the donor layer, to form a buried brittle plane delimiting the thin layer between the buried brittle plane and a free surface of the donor layer, d) a step of direct liquid injection-chemical vapor deposition, at a temperature below 1000° C., to form a carrier layer directly on the free surface of the donor layer, the carrier layer being formed by an at least partially amorphous SiC matrix, e) a step of separating along the buried brittle plane to form, on the one hand, an intermediate composite structure comprising the thin layer on the carrier layer and, on the other hand, the rest of the donor substrate, f) a step of heat treatment at a temperature of between 1000° C. and 1800° C., applied to the intermediate composite structure, to crystallize the carrier layer and to form the polycrystalline carrier substrate, g) a step of mechanical and/or chemical treatment(s) of the composite structure, the treatment(s) being applied to a free face of the carrier substrate, the rear face of the composite structure, and/or to a free face of the thin layer, the front face of the composite structure.

According to other advantageous and non-limiting features of the present disclosure, taken alone or in any technically feasible combination:

the deposition step d) is performed at a temperature of between 100° C. and 700° C., or even preferentially between 200° C. and 600° C.;

the deposition step d) is performed at a pressure of between 1 Torr and 500 Torr;

the precursors used during the deposition step d) are chosen from polysilylethylene and disilabutane;

on conclusion of the deposition step d), the carrier layer has a thickness of greater than or equal to 10 microns, or even a thickness of greater than or equal to 50 microns, or even a thickness of greater than or equal to 100 microns, or even a thickness of greater than or equal to 200 microns;

chemical etching, mechanical grinding and/or mechanochemical polishing is (are) applied to a free face of the carrier layer, between step d) and step e);

step a) comprises the formation, on the initial substrate, of a monocrystalline conversion layer, to convert basal plane dislocation defects of the initial substrate into threading edge dislocation defects;

the epitaxial growth step b) is performed at a temperature above 1200° C., preferentially between 1500° C. and 1650° C.;

the separation step e) is performed at a temperature above the deposition temperature of step d);

the separation step e) takes place during the deposition step d), preferentially at the end of step d);

the separation step e) and the crystallization step f) take place during the same heat treatment;

step g) comprises simultaneous mechanochemical polishing of a front face and of a rear face of the composite structure;

the process comprises a step of reconditioning the rest of the donor substrate for the purpose of reuse as initial substrate or as donor substrate.

BRIEF DESCRIPTION OF THE DRAWINGS

Other features and advantages of the present disclosure will become apparent from the following detailed description of example embodiments of the present disclosure, which is given with reference to the accompanying figures, in which.

DETAILED DESCRIPTION

In the description, the same reference numerals in the figures might be used for elements of the same type. The figures are schematic representations, which, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures.

Figure 1:
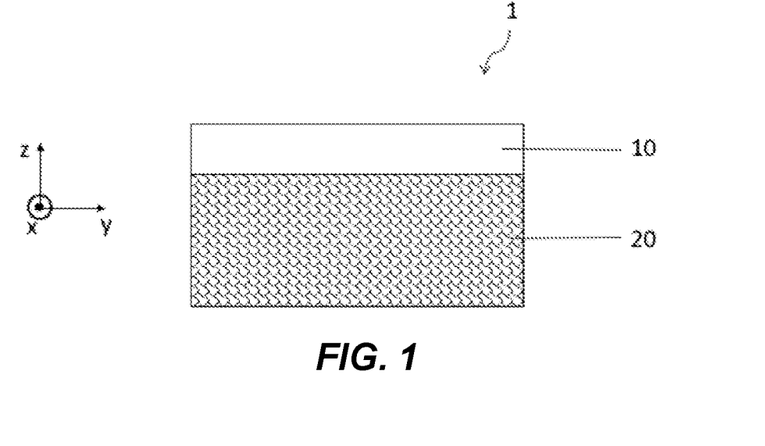
FIG. 1 shows a composite structure produced according to a production process in accordance with the present disclosure.

The present disclosure relates to a process for manufacturing a composite structure 1 comprising a thin layer 10 of monocrystalline silicon carbide arranged on a carrier substrate 20 made of silicon carbide (FIG. 1). The carrier substrate 20 is advantageously polycrystalline ("p-SiC" will be used to refer to polycrystalline SiC).

Figure 2A:
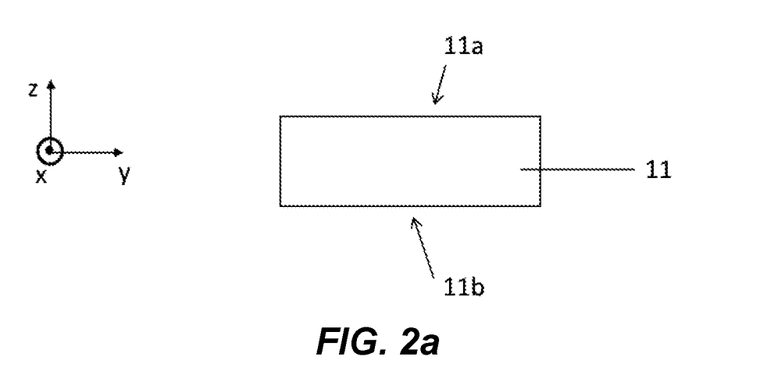
FIGS. 2a to 2g show steps of a manufacturing process in accordance with the present disclosure.

The process first comprises a step a) of providing an initial substrate 11 made of monocrystalline silicon carbide (FIG. 2a). Throughout the rest of the description, "c-SiC" will be used to refer to monocrystalline silicon carbide.

The initial substrate 11 is preferentially in the form of a wafer with a diameter of 100 mm, 150 mm or 200 mm, or even 300 mm or even 450 mm, and a thickness typically between 300 and 800 microns. It has a front face 11a and a rear face 11b. The surface roughness of the front face 11a is advantageously chosen to be less than 1 nm Ra (average roughness), measured by atomic force microscopy (AFM) in a scan of 20 microns×20 microns.

Figure 2B:
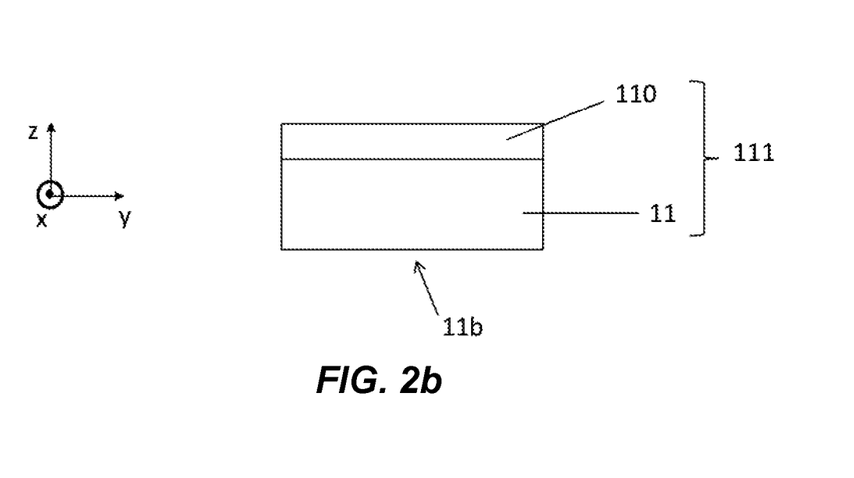

The process then comprises a step b) of epitaxial growth of a monocrystalline silicon carbide donor layer 110 on the initial substrate 11, to form a donor substrate 111 (FIG. 2b). The epitaxial growth step is performed so that the donor layer 110 has a crystal defect density less than that of the initial substrate 11.

Typically, the initial substrate 11 made of c-SiC is of the 4H or 6H polytype, with an offcut angle less than 4.0° relative to the <11-20> crystallographic axis±0.5°, and a micropipe density of less than or equal to 5/cm$^2$, or even less than 1/cm$^2$. For example, when N-(nitrogen-)doped, it preferentially has a resistivity of between 0.015 ohm·cm and 0.030 ohm·cm. An initial substrate 11 having a low density of basal plane dislocation (BPD) defects, typically less than or equal to 3000/cm$^2$, may be chosen. c-SiC substrates having BPD densities on the order of 1500/cm$^2$ are reasonably available, which facilitates their supply.

It is desirable for the donor layer 110, from which the c-SiC thin layer 10 of the composite structure 1 will be formed on conclusion of the process of the present disclosure, to have a crystal quality greater than that of the initial substrate 11, to meet the specifications required for the vertical components intended to be produced on the thin layer 10. Various types of extended defects are present in a c-SiC layer or substrate. These extended defects may affect the performance and reliability of the components. In particular, defects of BPD type are fatal for bipolar components: specifically, a Shockley stacking fault (or SSF) is extended from the dislocation when the energy for recombination of an electron-hole pair is available. The expansion of an SSF stacking fault inside the active region of the component brings about an increase in the passing state resistance of the component.

The c-SiC donor layer 110 is thus produced so as to have a BPD defect density of less than or equal to $1/cm^2$.

For this, the epitaxial growth step b) is performed at a temperature above 1200° C., preferentially between 1500° C. and 1650° C. The precursors used are silane (SiH4), propane (C3H8) or ethylene (C2H4); the carrier gas may be hydrogen with or without argon.

The low content of BPD defects in the donor layer 110 is obtained by favoring the conversion of the BPD defects present in the initial substrate 11 into threading edge dislocations (TED).

Figure 3A:
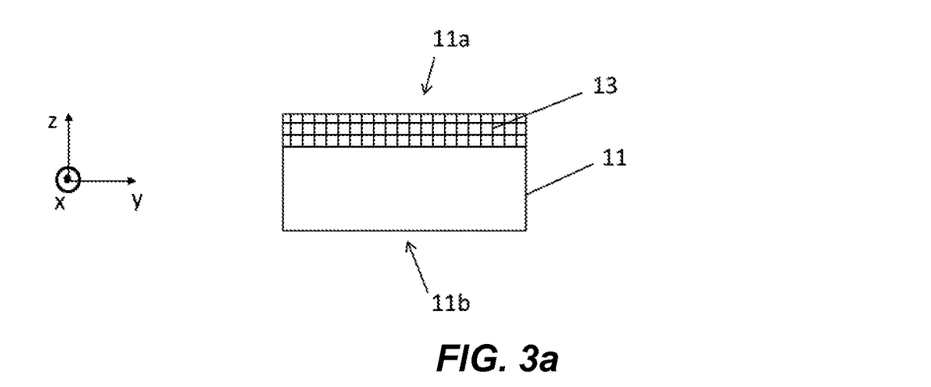
FIGS. 3a and 3b show steps of a manufacturing process in accordance with the present disclosure.

According to a particular embodiment, step a) comprises the formation of a monocrystalline conversion layer 13, preferentially based on c-SiC, to maximize the conversion of the BPD defects of the initial substrate 11 into TED defects (FIG. 3a). For this, it is advantageous to choose a low cutting angle close to 4° for the initial c-SiC substrate 11, to increase the in situ etching performed before the epitaxial growth, to target large growth rates (typically greater than 5 µm/h) and finally to choose growth conditions for the monocrystalline conversion layer 13, with a C/Si ratio in the precursor streams of close to 1.

Figure 3B:
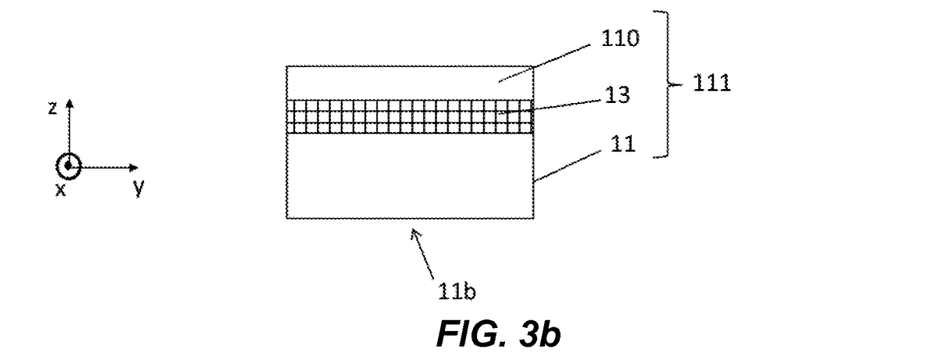

Step b) then comprises performing the epitaxial growth of the donor layer 110 on the conversion layer 13 (FIG. 3b). According to this particular embodiment, it is also possible to obtain a c-SiC donor layer 110 with a BPD defect density of less than or equal to $1/cm^2$ or even less than $0.1/cm^2$. Furthermore, the probability of bipolar degradation (probability of a hole arriving under the BPD/TED conversion point) on conclusion of the process according to the present disclosure is negligible (<0.1%), the monocrystalline conversion layer 13 not being intended to be transferred into the composite structure 1. The prior art directed toward reducing bipolar degradations consists in incorporating, between the conversion layer and the active layer, a recombination layer (nitrogen-doped beyond 1E18 at/$cm^3$). This layer can, at the cost of a thickness of 10 µm and of a concentration of greater than 5E18/$cm^3$, reduce the probability of the presence of holes to 0.1% relative to the base structure not including this recombination layer. In the present disclosure, since the monocrystalline conversion layer 13 is not transferred, the probability of a hole reaching the nucleation point of the bipolar degradation (point of BPD-TED conversion or any BPD point) is at least less than 0.1%, or even very close to 0%.

It is noted that conventional sequences of cleaning or etching of the initial substrate 11, directed toward eliminating all or some of the particulate, metallic or organic contaminants, or a native oxide layer, which are potentially present on its front face 11a, may be performed prior to the epitaxial growth step b).

Figure 2C:
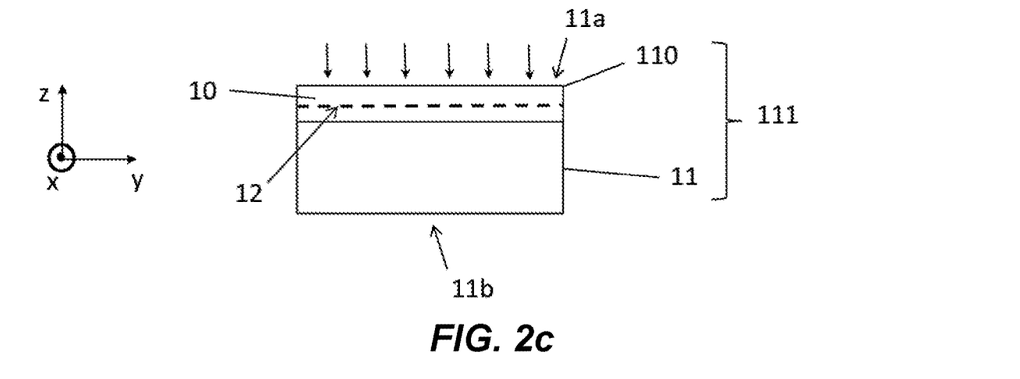

The manufacturing process according to the present disclosure also comprises a step c) of ion implantation of light species into the donor layer 110, to a given depth representative of the desired thickness of the thin layer 10 and in all cases not reaching the initial substrate 11 (and/or the conversion layer 13, when this layer is present). This implantation generates a buried brittle plane 12 in the donor layer 110, which delimits the thin layer 10 between the buried brittle plane 12 and a free surface 11a of the donor layer 110 (FIG. 2c).

The implanted light species are preferentially hydrogen, helium or these two species co-implanted. As is well known with reference to the Smart Cut™ process, these light species will form, around the given depth, microcavities distributed in a thin layer parallel to the free surface 11a of the donor layer 110, i.e., parallel to the plane (x,y) in the figures. This thin layer is referred to as the buried brittle plane 12, for the sake of simplicity.

The energy for implanting the light species is chosen so as to reach the given depth in the donor layer 110.

Typically, hydrogen ions will be implanted at an energy between 10 keV et 250 keV, and at a dose between 5E16/cm2 and 1E17/cm2, to delimit a thin layer 10 having a thickness of about 100 to 1500 nm.

It should be noted that a protective layer could be deposited on the free face of the donor layer 110 prior to the ion implantation step. This protective layer may be composed of a material such as silicon oxide or silicon nitride, for example.

Figure 2D:
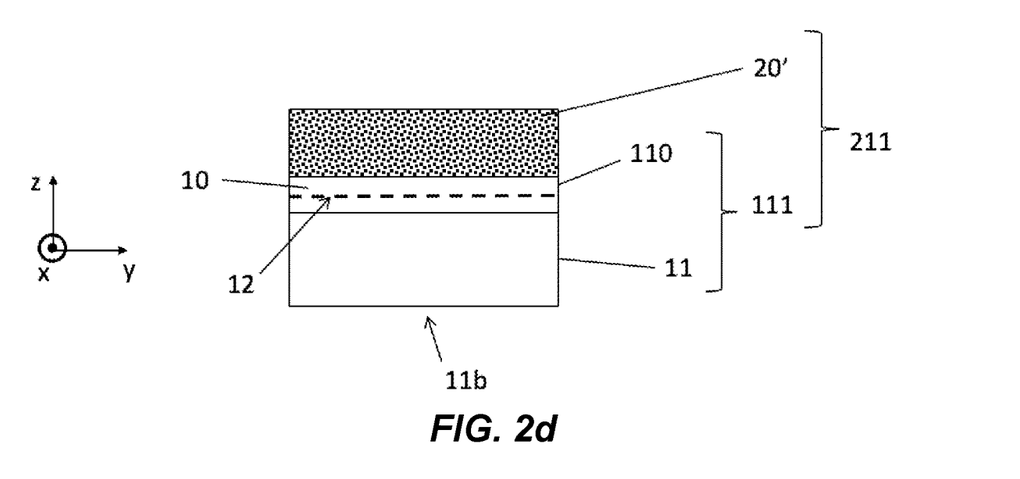

The process according to the present disclosure then comprises a step d) of direct liquid injection-chemical vapor deposition (DLI-CVD), at a temperature below 1000° C. and preferentially below 900° C., to form a carrier layer 20' directly on the free surface of the donor layer 110 (FIG. 2d). The deposition step d) may be performed at a temperature of between 100° C. and 800° C., between 100° C. and 700° C., or even advantageously between 200° C. and 600° C. The pressure in the deposition chamber is preferentially defined between 1 Torr and 500 Torr.

The DLI-CVD deposition technique affords good yields between the materials (precursors) supplied and the deposition thicknesses achieved, without the need to use chlorinated precursors, which limits the costs and the environmental constraints.

Preferentially, the DLI-CVD deposition involves a disilabutane precursor or a polysilylethylene precursor, the precursor being pure or diluted. Other precursors such as methyltrichlorosilane, ethylenetrichlorosilane, dichloromethylvinylsilane, tetraethylsilane, tetramethylsilane, diethylmethylsilane, bistrimethylsilylmethane or hexamethyldisilane may optionally be used.

Such a technique is described in the thesis by Guilhaume Boisselier (2013, "Dépôt chimique en phase vapeur de carbures de chrome, de silicium et d'hafnium assisté par injection liquide pulsée [Pulsed liquid injection-chemical vapor deposition of chromium, silicon and hafnium carbides]"), for applications in the deposition of ceramic coatings onto parts, to protect them during very high temperature treatments, for example, of steel or alloy metal parts.

A DLI-CVD deposition step d) has been developed for an entirely different application, namely the formation of a carrier layer 20' on a c-SiC donor layer 110, to obtain, on conclusion of the manufacturing process, a composite structure 1 intended for the microelectronics field.

The deposited carrier layer 20' forms an SiC matrix comprising amorphous SiC, and reaction byproducts derived from the precursors used during the deposition and formed from carbon chains. In addition, the SiC matrix may optionally comprise crystalline SiC grains.

The DLI-CVD technique can afford a deposition rate of greater than or equal to 10 microns/hour, or even greater than 50 microns/hour, or else even greater than 100 microns/hour. Given the mean deposition temperature, the deposition rate does not need to be high (beyond obvious economic reasons), since the heat-activated growth of the cavities of the buried brittle plane 12 remains slow within these temperature ranges, making it easily possible to achieve a thickness of carrier layer 20' that is capable of ensuring a stiffening effect with respect to the buried brittle plane 12.

On conclusion of step d), the carrier layer 20' has a thickness of greater than or equal to 10 microns, 50 microns, 100 microns or even greater than or equal to 200 microns. The stack 211 resulting from step d) comprises the carrier layer 20' arranged on the donor layer 110, which is itself arranged on the initial substrate 11.

Figure 2E:
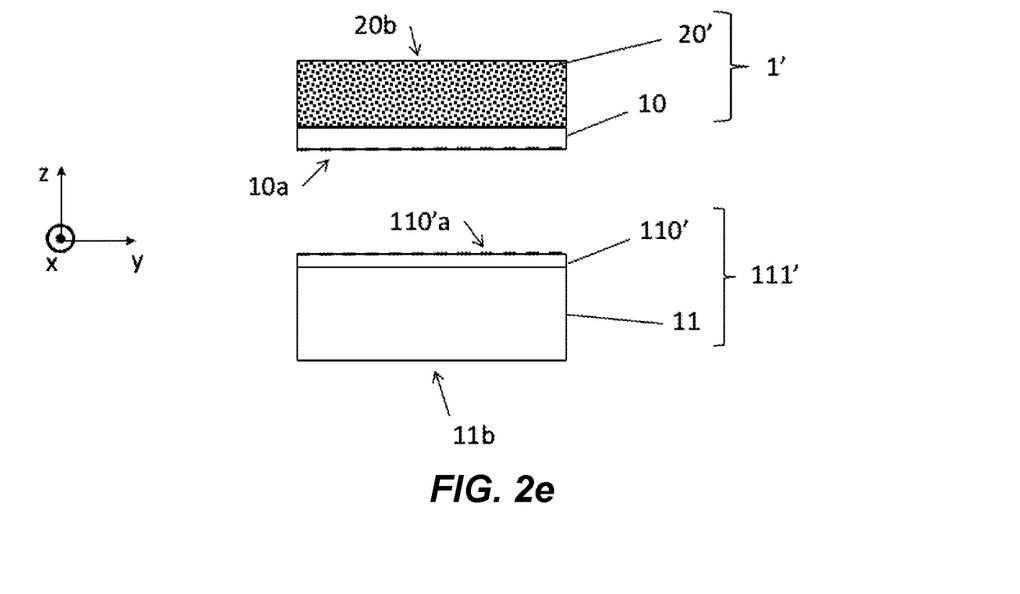

The process according to the present disclosure then comprises a step e) of separation along the buried brittle plane 12, to form, on the one hand, the intermediate composite structure 1' and, on the other hand, the rest 111' of the donor substrate (FIG. 2e).

According to an advantageous embodiment, the separation step e) is performed by applying a heat treatment to the stack 211, at a separation temperature above the deposition temperature of step d). Specifically, the microcavities present in the buried brittle plane 12 follow growth kinetics until the initiation of a fracture wave, which will propagate across the entire extent of the buried brittle plane 12 and result in separation between the intermediate composite structure 1' and the rest of the initial substrate 111'. In practice, the temperature may be between 950° C. and 1200° C. and preferentially between 1000° C. and 1200° C., as a function of the implantation conditions of step c).

According to an alternative embodiment, the separation step e) is performed by applying a mechanical stress to the stack 211, optionally preceded by a heat treatment to embrittle the buried brittle plane 12. The stress may be exerted, for example, by inserting a tool (e.g., razor blade) close to the buried brittle plane 12. By way of example, the separation stress may be on the order of a few GPa, preferentially greater than 2 GPa.

According to yet another embodiment, step e) of separation along the buried brittle plane 12 is performed during or directly at the end of the DLI-CVD deposition step d), in particular when the deposition temperatures are in the range 900° C.-1000° C.

The manufacturing process according to the present disclosure then comprises a step f) of heat treatment at a temperature of between 1000° C. and 1800° C., applied to the intermediate composite structure 1', to crystallize the carrier layer 20' and to form the polycrystalline carrier substrate 20.

The annealing atmosphere may notably comprise gases such as argon, nitrogen, hydrogen, helium or a mixture of these gases.

Such annealing has the effect of eliminating the hydrogen from the carrier layer 20' and bringing about crystallization of the SiC matrix in the form of polycrystalline SiC.

A conventional furnace for treating a plurality of structures simultaneously (batch annealing) may be used to perform the crystallization heat treatment. The typical duration of the treatment is then between a few minutes and a few hours.

It may optionally be envisaged to perform the crystallization heat treatment in situ, in the DLI deposition chamber, for a typical duration on the order of a few minutes.

Advantageously, the temperature increase and decrease ramps will be limited, for example, to less than 20°/minute, less than 5°/minute or even less than 1°/minute, to limit the appearance of cracks or structural defects in the crystalline layer.

After step f), a composite structure 1 is obtained comprising a thin layer 10 of monocrystalline silicon carbide arranged on a carrier substrate 20 made of polycrystalline silicon carbide.

The deposition parameters (step d) and crystallization annealing parameters (step f) are determined so that the carrier substrate 20 has:

good electrical conductivity, i.e., a resistance less than or equal to 0.03 ohm·cm, or even less than or equal to 0.01 ohm·cm, high thermal conductivity, i.e., greater than or equal to 150 W·m$^{-1}$·K$^{-1}$, or even greater than or equal to 200 W·m$^{-1}$·K$^{-1}$, and a coefficient of thermal expansion close to that of the thin layer 10, i.e., typically between 3.8E-6/K and 4.2E-6/K at room temperature.

To obtain these properties, the following structural characteristics are preferentially targeted for the carrier substrate 20: polycrystalline structure, grains of 3C SiC type, [111] oriented, with a mean size of 1 to 50 μm in the main plane of the substrate, N-type doping for a final resistivity of less than or equal to 0.03 ohm·cm, or even less than or equal to 0.01 ohm·cm.

Furthermore, a non-insulating interface between the donor layer 110 and the carrier substrate 20 is preferentially targeted. A specific resistance of the interface typically less than 1 mohm·cm$^2$ is typically expected. To ensure the electrical conductivity of the interface, removal of the native oxide present on the free face of the donor layer 110 is performed by HF (hydrofluoric acid) deoxidation, via a wet or dry route, prior to the deposition step d). Alternatively, overdoping at least of the first deposited nanometers of the carrier layer 20' may be performed by introducing dopant species during the DLI-CVD deposition step d). It should be noted that, in general, dopant species may be introduced (in various dosages) during the deposition step d) according to the level of doping and the electrical conductivity targeted for the carrier substrate 20, which conductivity will be effective on conclusion of the crystallization annealing of step f).

Advantageously also, prior to the deoxidation and/or to the formation of the carrier layer 20', cleaning sequences are applied to the donor substrate 111 to remove all or some of the particulate, metallic or organic contaminants potentially present on its free faces.

As is known per se, on conclusion of the separation step e), the free face 10a of the thin layer 10 of the composite structure 1 has a surface roughness of between 5 and 100 nm RMS (measured with an atomic force microscope (AFM), on scans of 20 microns×20 microns).

Figure 2F:
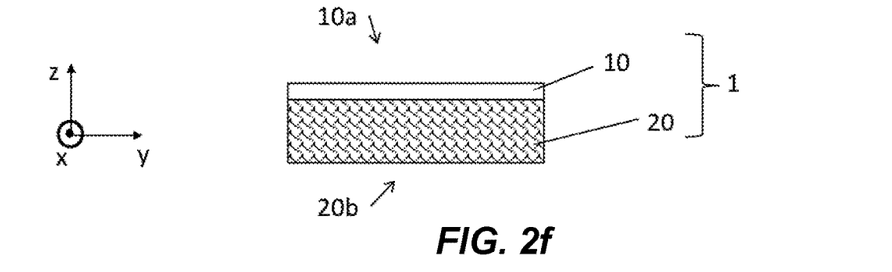

A step g) of mechanical and/or chemical treatment(s) of the composite structure 1 is thus envisaged to smooth the free face 10a of the thin layer 10 and/or to correct the thickness uniformity of the composite structure 1 (FIG. 2f).

Step g) may comprise chemical-mechanical polishing (CMP) of the free face 10a of the thin layer 10, typically with removal of material on the order of 50 nm to 1000 nm, so as to obtain a final roughness of less than 0.5 nm RMS (on an AFM field of 20×20 μm), or even less than 0.3 nm. Step g) may also comprise a chemical or plasma treatment (cleaning or etching), for example, cleaning of SC1/SC2 type (Standard Clean 1, Standard Clean 2) and/or HF (hydrofluoric acid), and/or an N2, Ar, CF4, etc., plasma, to further improve the quality of the free face 10a of the thin layer 10.

It is important to note that the crystallization of the carrier layer 20' often causes cracks or structural defects in the crystalline layer (which forms the carrier substrate 20), which has an impact on its mechanical and electrical quality.

Thus, step g) may comprise mechanochemical polishing (MCP) and/or a chemical treatment (etching or cleaning)

and/or a mechanical treatment (rectification) of the rear face 20b of the carrier substrate 20, so as to eliminate all or some of the cracks and structural defects, to improve the thickness uniformity of the carrier substrate 20 and also its roughness on the rear face 20b. The thickness removed at the rear face may be between about 100 microns and a few microns.

A roughness of less than 0.5 nm RMS (measured with an atomic force microscope (AFM) on fields of 20 microns×20 microns) is desired to produce vertical components, for which at least one metal electrode will be present on the rear face 20b of the composite structure 1.

Polishing or rectification of the edges of the composite structure 1 may also be performed during this step g) to make the shape of its circular contour and the cutting edge waste compatible with the requirements of microelectronic manufacturing processes.

It should be noted that the treatments applied to the rear face 20b of the carrier substrate 20 may optionally be applied to the free face of the carrier layer 20', just before the separation step e), i.e., before the front face 10a of the composite structure 1 is laid bare, so as to limit its contamination, notably in the course of polluting or restrictive treatments such as chemical etching or mechanical grinding (rectification).

According to an advantageous embodiment, the mechanochemical treatment step g) comprises simultaneous polishing (CMP) of a front face 10a and of a rear face 20b of the composite structure 1, to make the composite structure 1 smooth and to improve its thickness uniformity. The polishing parameters may differ between the front face and the rear face, the smoothing of a c-SiC surface and of a p-SiC surface usually requiring different consumables. The mechanical component of the polishing is favored in particular for the rear face 20b when the carrier substrate 20 is made of p-SiC, to limit the preferential attack of the grain joints by the chemical component of the polishing. By way of example, the polishing parameters, such as the spin speed (polishing head and plate), the pressure, the concentration and physical properties of the abrasives (i.e., diamond nanoparticle diameter between about 10 nm and 1 µm), may be modified to accentuate the mechanical component.

Optionally, a step g') of heat treatment at a temperature of between 1000° C. and 1800° C., for about one hour and up to a few hours, is performed after step g). The object of this step is to stabilize the composite structure 1, by ensuring structural or surface defects, still present in and/or on the thin layer 10, and, where appropriate, by making the crystalline configuration of the carrier substrate 20 evolve substantially, so that the composite structure 1 is compatible with the subsequent high-temperature heat treatments required for the manufacture of components on the thin layer 10.

Figure 2G:
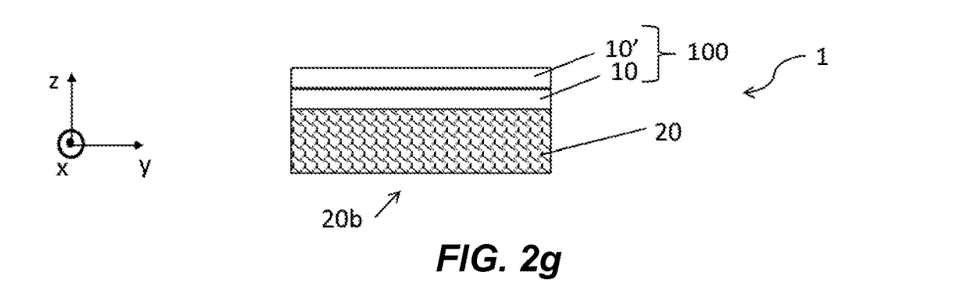

The process according to the present disclosure may comprise a second step h) of epitaxial growth of an additional layer 10' of monocrystalline silicon carbide on the thin layer 10 of the composite structure 1 (FIG. 2g). Such a step is applied when a relatively large thickness of working layer 100 is required for the manufacture of components, typically from about 5 to 50 microns.

It may be chosen to limit the temperatures applied during this step h), so as to restrict the stresses induced in the working layer 100 (corresponding to the combination of the thin layer 10 and the additional layer 10') because of the composite structure 1.

Finally, the manufacturing process may comprise a step of reconditioning the rest 111' of the donor substrate for the purpose of reuse as initial substrate 11 or as donor substrate 111. Such a reconditioning step is based on one or more treatments of the face 110'a (FIG. 2e), by surface or edge mechanochemical polishing, and/or by mechanical rectification, and/or by wet or dry chemical etching.

Preferentially, the thickness of the donor layer 110 formed in step b) is defined so that the rest 111' of the donor substrate 111 can be reused at least twice as donor substrate 111.

Preferentially, when the conversion layer 13 is present, care will be taken to keep the layer intact, i.e., to always keep a portion of donor layer 10 on the rest 111' of the donor substrate. Thus, when the portion of donor layer 10 is insufficient for the production of a composite structure 1, only the step of epitaxial growth of the donor layer 10 is necessary and not the prior step of growth of the conversion layer 13.

Example

According to a non-limiting implementation example, the initial substrate 11 provided in step a) of the manufacturing process is a wafer made of c-SiC of 4H polytype, with an orientation of 4.0° relative to the <11-20> axis±0.5°, with a diameter of 150 mm and a thickness of 350 µm.

A conventional RCA cleaning sequence (Standard Clean 1+Standard Clean 2) followed by Caro's acid (mixture of sulfuric acid and hydrogen peroxide) and then HF (hydrofluoric acid) is performed on the initial substrate 11 prior to step b) of epitaxial growth of the c-SiC donor layer 110.

The growth is performed in an epitaxy chamber, at a temperature of 1650° C., with precursors such as silane (SiH4) and propane (C3H8) or ethylene (C2H4), generating the c-SiC donor layer 110 with a thickness of 30 microns (growth rate: 10 microns/h). The donor layer has a BPD defect density on the order of $1/cm^2$.

Hydrogen ions are implanted at an energy of 150 keV and a dose of 6E16 $H+/cm^2$ through the free surface of the donor layer 110. A buried brittle plane 12 is thus created at a depth of about 800 nm in the initial substrate 11.

A cleaning sequence of RCA+Caro's acid is performed on the donor substrate 111 so as to remove potential contaminants from the free face of the donor layer 110.

DLI-CVD deposition is performed on the donor layer 110, at a temperature of 800° C., with the disilabutane (DSB) precursor, at a pressure of 50 Torr, for 60 minutes, so as to reach a thickness of at least 150 microns for the carrier layer 20'. Under these conditions, the carrier layer 20' is deposited in the form of an amorphous SiC matrix, comprising reaction byproducts derived from the deposition precursors.

Annealing at 1000° C. is then applied to the stack 211 for 50 minutes, and separation is performed on the buried brittle plane 12 during the annealing. On conclusion of this separation step e), the intermediate composite structure 1' formed of the thin layer 10 and of the carrier layer 20' is separated from the rest 111' of the donor substrate.

A crystallization heat treatment at 1200° C. for 1 hour under an argon atmosphere is then applied to the intermediate composite structure 1', to form the poly-SiC carrier substrate 20 of the composite structure 1.

Alternatively, the separation and the crystallization may be performed during the same heat treatment, for example, at 1200° C. under a neutral atmosphere.

Mechanical rectification of the rear face of the carrier substrate 20, removing about 15 to 30 microns, makes it possible to eliminate cracks and structural defects generated by the crystallization of the SiC matrix.

One or more mechanochemical polishing operations are then performed to restore the surface roughness of the thin layer 10 and of the rear face of the carrier substrate 20, followed by conventional cleaning sequences.

Needless to say, the present disclosure is not limited to the described embodiments and examples, and implementation variants thereof may be envisaged without departing from the scope of the invention as defined by the claims.

The invention claimed is:

1. A method for manufacturing a composite structure comprising a thin layer of monocrystalline silicon carbide arranged on a polycrystalline silicon carbide carrier substrate, the method comprising:
   a) a step of providing an initial substrate made of monocrystalline silicon carbide;
   b) a step of epitaxial growth of a monocrystalline silicon carbide donor layer (110) on the initial substrate to form a donor substrate, the donor layer having a density of crystal defects less than that of the initial substrate;
   c) a step of ion implantation of light species into the donor layer to form a buried brittle plane delimiting the thin layer between the buried brittle plane and a free surface of the donor layer;
   d) a step of direct liquid injection-chemical vapor deposition, at a temperature below 1000° C., to form a carrier layer directly on the free surface of the donor layer, the carrier layer being formed by an at least partially amorphous SiC matrix;
   e) a step of separating along the buried brittle plane to form an intermediate composite structure comprising the thin layer on the carrier layer, and a remainder of the donor substrate;
   f) a step of heat treatment at a temperature of between 1000° C. and 1800° C., applied to the intermediate composite structure, to crystallize the carrier layer and to form the polycrystalline carrier substrate; and
   g) a step of mechanical and/or chemical treatment(s) of the composite structure, the treatment(s) being applied to a free face of the carrier substrate at a rear face of the composite structure, and/or to a free face of the thin layer at a front face of the composite structure.

2. The method of claim 1, wherein the deposition step d) is performed at a temperature of between 100° C. and 700° C.

3. The method of claim 1, wherein the deposition step d) is performed at a pressure of between 1 Torr and 500 Torr.

4. The method of claim 1, wherein at least one precursor used during the deposition step d) comprises a precursor chosen from among the group consisting of polysilylethylene and disilabutane.

5. The method of claim 1, wherein, on conclusion of the deposition step d), the carrier layer has a thickness of greater than or equal to 10 microns.

6. The method of claim 1, wherein chemical etching, mechanical grinding and/or mechanical polishing is applied to a free face of the carrier layer between step d) and step e).

7. The method of claim 1, wherein step a) comprises the formation of a monocrystalline conversion layer on the initial substrate to convert basal plane dislocation defects of the initial substrate into threading edge dislocation defects.

8. The method of claim 1, wherein the epitaxial growth step b) is performed at a temperature above 1200° C.

9. The method of claim 1, wherein the separation step e) is performed at a temperature above the deposition temperature of step d).

10. The method of claim 1, wherein the separation step e) takes place during the deposition step d).

11. The method of claim 1, wherein the separation step e) and the crystallization step f) are performed during the same heat treatment.

12. The method of claim 1, wherein step g) comprises simultaneous chemical-mechanical polishing of a front face and a rear face of the composite structure.

13. The method of claim 1, further comprising a step of reconditioning the remainder of the donor substrate for reuse as an initial substrate or as a donor substrate.

14. The method of claim 2, wherein the deposition step d) is performed at a temperature of between 200° C. and 600° C.

15. The method of claim 5, wherein, on conclusion of the deposition step d), the carrier layer has a thickness of greater than or equal to 200 microns.

16. The method of claim 8, wherein the epitaxial growth step b) is performed at a temperature between 1500° C. and 1650° C.

17. The method of claim 10, wherein the separation step e) takes place at the end of the deposition step d).

18. A method for manufacturing a composite structure comprising a thin layer of monocrystalline silicon carbide arranged on a polycrystalline silicon carbide carrier substrate, the method comprising:
   providing an initial substrate comprising monocrystalline silicon carbide;
   epitaxially growing a monocrystalline silicon carbide donor layer on the initial substrate to form a donor substrate, the donor layer having a density of crystal defects less than that of the initial substrate;
   implantation light species ions into the donor layer to form a buried brittle plane delimiting the thin layer between the buried brittle plane and a free surface of the donor layer;
   depositing a carrier layer directly on the free surface of the donor layer using direct liquid injection-chemical vapor deposition at a temperature below 1000° C., the carrier layer comprising an at least partially amorphous SiC matrix;
   separating the donor substrate along the buried brittle plane to form an intermediate composite structure comprising the thin layer on the carrier layer, and a remainder of the donor substrate;
   applying a heat treatment to the intermediate composite structure at a temperature of between 1000° C. and 1800° C. to crystallize the carrier layer and form the polycrystalline carrier substrate; and
   applying at least one treatment comprising a mechanical treatment and/or a chemical treatment to the composite structure, the at least one treatment being applied to a free face of the carrier substrate and/or to a free face of the thin layer.

19. The method of claim 18, wherein the deposition step d) is performed at a temperature of between 100° C. and 700° C.

20. The method of claim 18, wherein the deposition step d) is performed at a pressure of between 1 Torr and 500 Torr.

* * * * *

UNITED STATES PATENT AND TRADEMARK OFFICE
CERTIFICATE OF CORRECTION

| | |
|---|---|
| PATENT NO. | : 12,362,173 B2 |
| APPLICATION NO. | : 17/756609 |
| DATED | : July 15, 2025 |
| INVENTOR(S) | : Hugo Biard |

It is certified that error appears in the above-identified patent and that said Letters Patent is hereby corrected as shown below:

In the Claims

| | | | |
|---|---|---|---|
| Claim 1, | Column 11, | Line 15, | change "layer (**110**) on the" to --layer on the-- |
| Claim 6, | Column 11, | Line 53, | change "and/or mechanical polishing" to --and/or chemical-mechanical polishing-- |

Signed and Sealed this
Thirtieth Day of September, 2025

John A. Squires
*Director of the United States Patent and Trademark Office*